(12) United States Patent
Satoh et al.

(10) Patent No.: US 7,009,459 B2
(45) Date of Patent: Mar. 7, 2006

(54) PIEZOELECTRIC OSCILLATOR HAVING A NON-INDUCTIVE LOAD WITH A COLLECTOR-EMITTER CAPACITOR

(75) Inventors: Tomio Satoh, Kouza-gun (JP); Jun Matsuoka, Kouza-gun (JP); Tsuyoshi Ohshima, Kouza-gun (JP)

(73) Assignee: Toyo Communication Equipment Co., Ltd., Kanagawa (JP)

( * ) Notice: Subject to any disclaimer, the term of this patent is extended or adjusted under 35 U.S.C. 154(b) by 116 days.

(21) Appl. No.: 10/676,400

(22) Filed: Oct. 1, 2003

(65) Prior Publication Data

US 2005/0073372 A1    Apr. 7, 2005

(51) Int. Cl.
    *H03B 5/32*    (2006.01)

(52) U.S. Cl. ............ 331/158; 331/116 R; 331/107 A
(58) Field of Classification Search ........... 331/160, 331/158, 73, 116 R, 107 A, 139
See application file for complete search history.

(56) References Cited

U.S. PATENT DOCUMENTS

| | | | | |
|---|---|---|---|---|
| 4,193,046 A | * | 3/1980 | Chiba | 331/109 |
| 5,523,722 A | * | 6/1996 | Nakano et al. | 331/107 A |
| 5,789,990 A | * | 8/1998 | Ash et al. | 331/107 A |
| 5,920,234 A | * | 7/1999 | Hill | 331/75 |
| 2001/0043125 A1 | * | 11/2001 | Sato | 331/117 R |

* cited by examiner

Primary Examiner—Joseph Chang
(74) Attorney, Agent, or Firm—Koda & Androlia

(57) ABSTRACT

A piezoelectric oscillation circuit has a series circuit composed of a capacitor Cbe as a part of a load capacitance and a capacitor Ce inserted and connected between a base of an oscillation transistor TR1 and the ground, and has an emitter resistor Re connected to a connection midpoint A of the series circuit and an emitter of the oscillation transistor TR1. Further, a base bias circuit composed of a resistor RB 1 and a resistor RB2 is connected to a base of the oscillation transistor TR1, has a piezoelectric element Xtal and a capacitor C1 inserted and connected in series between the base of the oscillation transistor TR1 and the ground, and further has a resistor Rc connected to a collector of the oscillation transistor TR1 together with the power supply voltage Vcc line, and has a capacitor Cce connected between the collector and the emitter.

5 Claims, 19 Drawing Sheets

$$r_1 = \frac{R}{1+(\omega CR)^2} \quad c_1 = \frac{1}{\omega^2 CR r_1}$$

1. $V3=0$

1. V2=0

PIEZOELECTRIC OSCILLATOR HAVING A NON-INDUCTIVE LOAD WITH A COLLECTOR-EMITTER CAPACITOR

BACKGROUND OF THE INVENTION

1. Field of the Invention

The present invention relates to a piezoelectric oscillator, and relates, in particular, to a method of suppressing a current of a piezoelectric element.

2. Description of the Related Art

In recent years, following a request for a smaller size and higher performance of a mobile communication apparatus and a transmission communication apparatus, a piezoelectric oscillator such as a crystal vibrator used as a frequency control device in these apparatuses is also required to have a smaller size and higher stability. The piezoelectric oscillator has a configuration of a combined oscillation circuit including a frequency adjusting circuit and a frequency temperature compensation circuit, to work for a piezoelectric vibrator such as a crystal vibrator.

The piezoelectric vibrator is an electromechanical vibrator. As smaller amount of current flows to the piezoelectric vibrator (hereinafter referred to as a vibrator current), the piezoelectric vibrator has higher reliability in aging. FIG. 18 illustrates one example of a Colpitts oscillation circuit according to a conventional silicon transistor. A piezoelectric oscillation circuit has the following configuration. A series circuit composed of a capacitor Cb and a capacitor Ce as a part of a load capacitance is inserted and connected between a base of an oscillation transistor TR11 and the ground. A connection midpoint of the series circuit and an emitter of the oscillation transistor TR11 are connected together, and an emitter resistor Re is also connected to the connection midpoint. Furthermore, a base bias circuit composed of a resistor RB11 and a resistor RB12 is connected to the base of the oscillation transistor TR11. A series circuit of a piezoelectric vibrator Xtal and a capacitor C11 is inserted and connected between the base of the oscillation transistor TR11 and the ground. Further, a collector of the oscillation transistor TR11 and a power supply voltage Vcc line are connected together.

FIG. 19 illustrates one example of the Colpitts oscillation circuit according to the conventional silicon transistor connected in cascade. The configuration of the circuit in FIG. 19 is different from that shown in FIG. 18 in that a transistor TR12 of which base is connected to the ground is connected in cascade to the TR11. FIG. 21 illustrates an equivalent circuit when the circuits shown in FIG. 18 and FIG. 19 are in a steady oscillation. FIG. 22 illustrates an equivalent circuit in a state that the parallel connection is converted to a series connection. The vibrator current is calculated with reference to this equivalent circuit, based on the following conditions. First, as an assumption, the emitter output of the oscillation during the normal time is set as the constant voltage supply Ve, and the resistance Re and the capacitor Ce of the emitter circuit are set as the internal impedance of the power supply. As the piezoelectric vibrator oscillates in series resonance, the impedance is set to 0. Calculation expressions based on the above conditions are as follows.

$r1 = R\pi/\{1+(\omega(Cb+C\pi)R\pi)^2\}$ $c1 = 1/\omega^2(Cb+C\pi)R\pi \cdot r1$ $r2 = Re/\{1+(\omega \cdot Ce \cdot Re)^2\}$ $c2 = 1/\omega^2 \cdot Ce \cdot Re \cdot r2$ $z = r1 + 1/j\omega \cdot c1 + r2 + 1/j\omega \cdot c2 = r1+r2+1/j\omega \cdot (1/c1+1/c2)$ $$|ix| = Ve/Z = Ve/[(r1+r2)^2+\{1/\omega \cdot (1/c1+1/c2)\}^2]^{1/2} \quad (1)$$

where

Z represents an impedance between the voltage supply Vcc end of the crystal oscillator and the ground, r1 and r2 represent resistors based on the parallel-to-series conversion shown in FIG. 22, c1 and c2 represent capacitors based on the parallel-to-series conversion shown in FIG. 22, $R\pi$ represents an input resistance of the transistor in a parallel equivalent circuit shown in FIG. 21, $C\pi$ represents a junction capacitance of the transistor in the parallel equivalent circuit shown in FIG. 21, Re represents emitter additional resistance of the transistor in the parallel equivalent circuit shown in FIG. 21, Ce represents an emitter additional capacitor of the transistor in the parallel equivalent circuit shown in FIG. 21, $\omega$ represents an angular frequency ($=2\pi f$)

Ve represents a steady emitter output voltage, ix represents a vibrator current, and

|ix| represents an effective value of the vibrator current.

FIG. 23 illustrates a result of obtaining by simulation the vibrator current |ix| characteristics with the capacitor Cb based on the Exp. (1). The abscissa represents the capacitance Cb between the base and the emitter, and the ordinate represents the vibrator current ix. The simulation is carried out based on the following conditions. In the equivalent circuit shown in FIG. 21, $R\pi=2600\Omega$, $C\pi=12$ pF, Re=1K$\Omega$, Ce=150 pF, Ve=2 Vrms, and F=10 MHz. FIG. 24 illustrates a result of measuring a relationship between the capacitance Cb between the base and the emitter and the vibrator current ix when Re=1K$\Omega$, RB11=RB12=10K$\Omega$, and the respective emitter capacitors Ce are at 150 pF, 180 pF, and 200 pF in the circuit shown in FIG. 18. The abscissa represents the capacitance Cb between the base and the emitter, and the ordinate represents the vibrator current ix. From this result, it is clear that the capacitance Cb between the base and the emitter increases in the range from 0 pF to about 100 pF. In proportion to this increase, the vibrator current ix increases. When the Cb is in a higher range from 100 pF to the above, the vibrator current ix becomes substantially constant. The result of the experiment indicates that the vibrator current ix shows a maximum value of 6500 $\mu$A.

There is another method of suppressing the increase in the vibrator current. As shown in FIG. 20, a circuit is configured with an oscillation circuit 101 composed of a Colpitts circuit, and an AGC circuit 104. Diodes 116 and 117 rectify the oscillation output, and the base current of the oscillation circuit 104 is decreased, thereby to suppress the gain. The vibrator current is suppressed as a result. According to this method, the current suppression effect is large. However, the circuit apparently becomes complex, and this circuit cannot be easily mounted on a small oscillator, which results in cost increase.

According to the conventional Colpitts oscillation circuit, the vibrator current increases along the increase in the capacitance between the base and the emitter, and there is a limit to the suppression of the vibrator current. Further, according to the method using the AGC circuit, the circuit becomes complex. Consequently, the circuit cannot be provided in a smaller size, which leads to cost increase.

SUMMARY OF THE INVENTION

The present invention has been made in the light of the above problems. It is an object of the present invention to provide a piezoelectric oscillator that can easily suppress the vibrator current in a simple circuit configuration.

In order to solve the above problems, according to a first aspect of the present invention, there is provided a piezoelectric oscillator comprising a piezoelectric vibrator that has a piezoelectric element which is excited in a predetermined frequency, an oscillation amplifier transistor that excites the piezoelectric element by flowing a current to the piezoelectric element, a combined capacitor that is connected between a base of the oscillation amplifier transistor and the ground and that forms a part of a load capacitance, and an emitter resistor that is inserted between an emitter of the oscillation amplifier transistor and the ground, wherein a non-inductive load is connected to a collector of the oscillation amplifier transistor, and a capacitor is inserted between the collector and the emitter of the oscillation amplifier transistor.

The inductive load is connected to the collector of the oscillation transistor of the conventional Colpitts oscillation circuit, and the collector and the emitter are connected with a capacitor. With this arrangement, the vibrator current can be decreased rapidly. This can be done because the phase of the emitter output and the phase of the collector output of the oscillation transistor are basically shifted by 180 degrees. As both signals are inverted, the output can be suppressed by connecting the inverted output with a capacitor Cce.

According to this aspect of the invention, the output can be suppressed by connecting the collector and the emitter of the oscillation transistor with a capacitor. Therefore, the vibrator current can be decreased, and the negative resistance can be increased.

According to a second aspect of the present invention, the combined capacitor is composed of a capacitor that is connected between the base and the emitter of the oscillation amplifier transistor and a capacitor that is connected between the emitter and the ground, and the base of the oscillation amplifier transistor is biased at a predetermined potential.

The oscillation circuit according to this aspect of the invention is basically a Colpitts circuit. A capacitor is connected between the base and the emitter of the oscillation amplifier transistor as a basic configuration of the circuit, and another capacitor is connected between the emitter and the ground, thereby to provide a bias circuit. A piezoelectric vibrator and a frequency adjusting capacitor are connected in series between the base of the oscillation amplifier transistor and the ground.

According to this aspect of the invention, as the basic oscillation circuit is a Colpitts oscillator, the circuit configuration is simple, and a stable oscillation can be achieved.

According to a third aspect of the present invention, there is provided a piezoelectric oscillator comprising a piezoelectric vibrator that has a piezoelectric element which is excited in a predetermined frequency, an oscillation amplifier transistor that continuously excites the piezoelectric element by flowing a current to the piezoelectric element, a combined capacitor that is connected between a base of the oscillation amplifier transistor and the ground and that forms a part of a load capacitance, and an emitter resistor that is inserted between an emitter of the oscillation amplifier transistor and the ground, wherein a second transistor is connected in cascade to the collector of the oscillation amplifier transistor, a non-inductive load is connected to a collector of the second transistor connected in cascade, and a capacitor is inserted between the collector of the second transistor and the emitter of the oscillation amplifier transistor.

In the cascade connection, a first stage (i.e., the second transistor in the present invention) is a grounded-emitter circuit, and a second stage (i.e., the oscillation amplifier transistor in the present invention) is a grounded-base circuit. High-frequency characteristics of the grounded-emitter circuit are degraded in the feedback of the capacitance between the collector and the base. Therefore, by connecting the transistors in cascade, the load of the grounded-emitter circuit becomes a negative load as the load is an input resistance of the grounded-base circuit. Therefore, there is an effect of decreasing the capacitance between the collector and the base.

According to this aspect of the invention, as the transistors are connected in cascade, the total gain is equivalent to that of the grounded-emitter circuit. The bandwidth can be secured up to the cut-off frequency of the grounded-base circuit. Therefore, an oscillator having excellent high-frequency characteristics can be obtained.

According to a fourth aspect of the present invention, a base side of the second transistor is grounded via a capacitor.

As explained in the third aspect of the invention, the second transistor is the grounded-emitter circuit. Therefore, the non-inductive load is connected to the collector of this circuit, and the base is grounded via the capacitance. Therefore, by connecting the grounded-emitter circuit in series with the grounded-base circuit, the cascade connection can be completed.

According to this aspect of the invention, by connecting the base of the second transistor to the ground via the capacitor, this transistor can be made as the grounded-emitter circuit. Therefore, a cascade circuit can be configured together with a transmission transistor.

According to a fifth aspect of the present invention, the combined capacitor is connected between the base and the emitter of the oscillation amplifier transistor and between the emitter and the ground respectively, and the bases of the oscillation amplifier transistor and the second transistor are biased at a predetermined potential respectively.

The oscillation circuit according to this aspect of the invention is basically a Colpitts circuit. A capacitor is connected between the base and the emitter of the oscillation amplifier transistor as a basic configuration of the circuit, and another capacitor is connected between the emitter and the ground. Further, a grounded-emitter circuit is connected to the collector of the oscillation amplifier transistor. The bases of these transistors are biased at a predetermined potential respectively. A piezoelectric vibrator and a frequency adjusting capacitor are connected in series between the base of the oscillation amplifier transistor and the ground.

According to this aspect of the invention, the bases of the oscillation amplifier transistor and the second transistor are biased at a predetermined potential respectively. Therefore, an oscillator having little waveform distortion can be obtained.

According to a sixth aspect of the present invention, the value of the capacitance inserted between the collector and the emitter is at or above the value of the capacitance inserted between the emitter of the oscillation amplifier transistor and the ground.

A relation between the capacitance and the impedance is that when the capacitance increases in a predetermined frequency, the impedance decreases, and when the capacitance decreases, the impedance increases. Therefore, the capacitance of the capacitor inserted between the collector and the emitter is set equal to or higher than the capacitance of the capacitor inserted between the emitter and the ground. With this arrangement, a signal is suppressed based on a phase-inverted output while arranging the impedance.

According to this aspect of the invention, the capacitance of the capacitor inserted between the collector and the emitter is set approximately equal to or higher than the capacitance of the capacitor inserted between the emitter of the oscillation amplifier transistor and the ground. With this arrangement, signals of substantially the same impedance are suppressed. Therefore, an oscillation waveform having little waveform distortion can be output.

According to a seventh aspect of the present invention, by setting a predetermined value of the capacitance which is inserted into between the collector and the emitter, a collector output voltage and an emitter output voltage of the oscillation amplifier transistor are suppressed, and as a result, a current of the piezoelectric element is also suppressed at the same time.

As explained in the first aspect of the invention, the phase of the emitter output and the phase of the collector output of the oscillation transistor are basically shifted by 180 degrees. By connecting the collector and the emitter together via the capacitor, the collector output voltage and the emitter output voltage are cancelled each other and are suppressed. As a result, a current that flows to the base is also suppressed. A current that flows to the piezoelectric element which is connected between the base and the ground is inevitably suppressed.

According to this aspect of the invention, the vibrator current can be decreased while securely carrying out oscillation.

DETAILED DESCRIPTIONS

Exemplary embodiments of the present invention will be explained below with reference to the accompanying drawings. Unless specified otherwise, the range of the present invention is not limited to constituent elements, kinds, combinations, shapes, and relative arrangements or the like described in the embodiments, and these are only explanatory examples.

Figure 1:
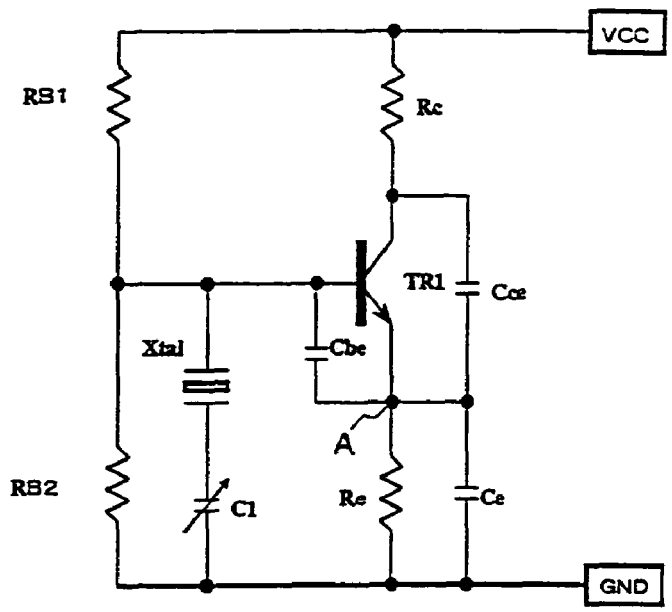
FIG. 1 illustrates one example of a Colpitts oscillation circuit according to the first embodiment of the present invention.

FIG. 1 illustrates one example of a Colpitts oscillation circuit according to the first embodiment of the present invention. A piezoelectric oscillation circuit has a series circuit composed of a capacitor Cbe and the capacitor Ce as a part of a load capacitance inserted and connected between a base of an oscillation transistor TR1 and the ground, and has a connection midpoint A of the series circuit and an emitter of the oscillation transistor TR1 connected together, and, further, has the emitter resistor Re inserted and connected between the connection midpoint A and the ground. Furthermore, a base bias circuit composed of a resistor RB1 and a resistor RB2 is connected to a base of the oscillation transistor TR1, a series circuit of the piezoelectric element Xtal and a capacitor C1 is inserted and connected between the base of the oscillation transistor TR1 and the ground, and further, a resistor Rc is connected between a collector of the oscillation transistor TR1 and the power supply voltage Vcc line, and a capacitor Cce is connected between the collector and the emitter of the oscillation transistor TR1.

Figure 2:
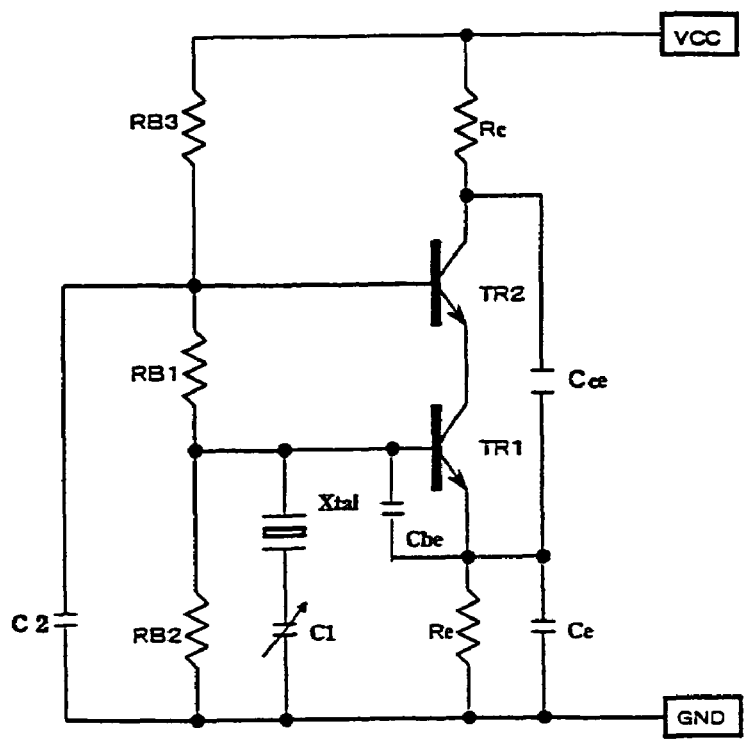
FIG. 2 illustrates one example of a Colpitts oscillation circuit according to the second embodiment of the present invention.

FIG. 2 illustrates one example of a Colpitts oscillation circuit according to the second embodiment of the present invention. Constituent elements that are the same as those shown in FIG. 1 are assigned with the same reference symbols, and a redundant explanation will be omitted. FIG. 2 is different from FIG. 1 in that a transistor TR2 of which base is grounded is connected in cascade to the transistor TR1, and that a capacitor Cce is inserted and connected between a collector of the transistor TR2 and the emitter of the transistor TR1. In the cascade connection, the transistor TR1 is a grounded-emitter circuit, and the transistor TR2 is a grounded-base circuit. High-frequency characteristics of the grounded-emitter circuit are degraded in the feedback of the capacitance between the collector and the base. Therefore, by connecting the transistors in cascade, the load of the grounded-emitter circuit becomes a negative load as the load is an input resistance of the grounded-base circuit. Therefore, there is an effect of decreasing the capacitance between the collector and the base. Consequently, the total gain is equivalent to that of the grounded-emitter circuit, and the bandwidth can be secured up to the cut-off frequency of the grounded-base circuit, therefore, an oscillator with excellent high-frequency characteristics can be configured.

Figure 20:
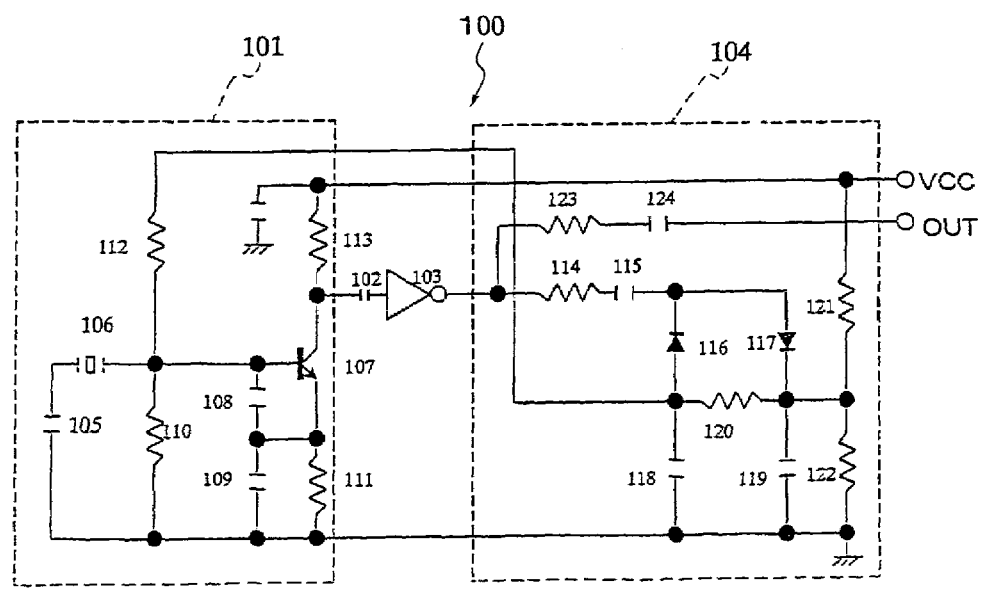
FIG. 20 illustrates the conventional Colpitts oscillation circuit added with an AGC circuit.
Figure 21:
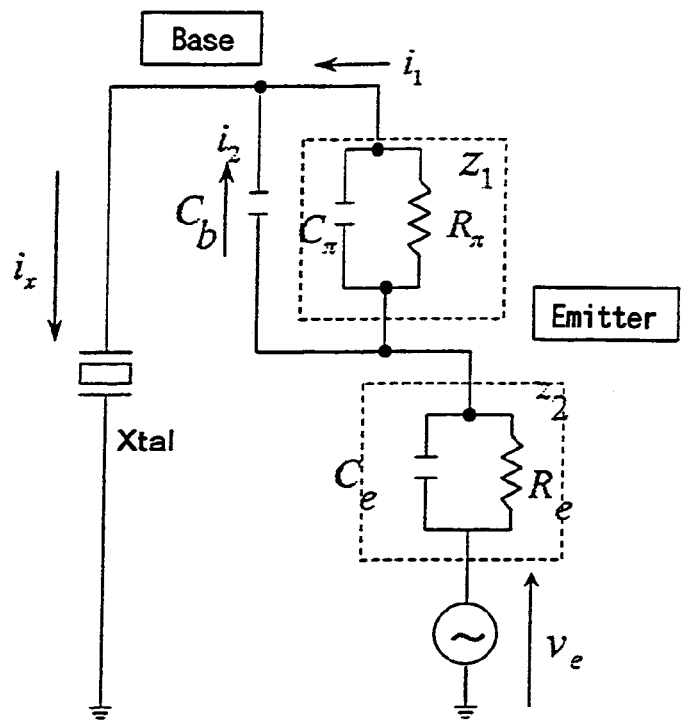
FIG. 21 illustrates an equivalent circuit when the conventional Colpitts oscillation circuit is in a steady oscillation.
Figure 22:
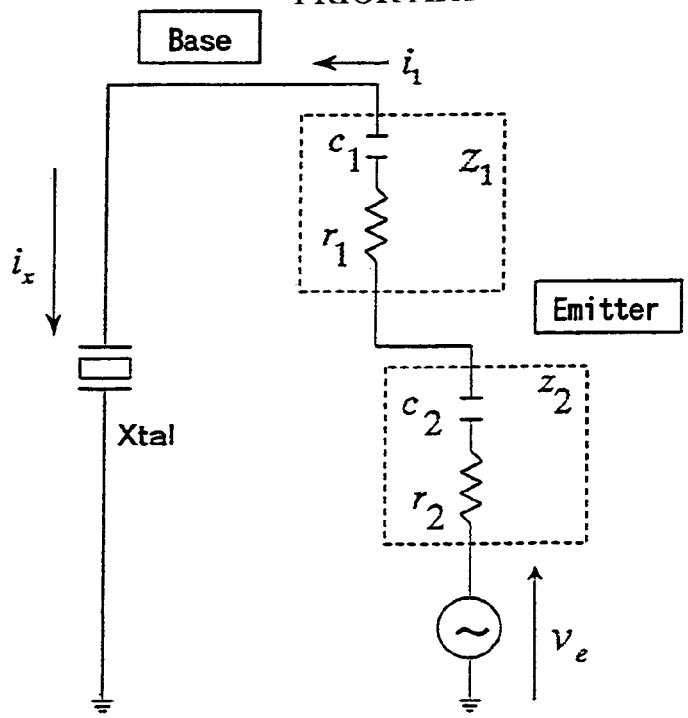
FIG. 22 illustrates a parallel-to-series conversion equivalent circuit of the conventional Colpitts oscillation circuit.
Figure 23:
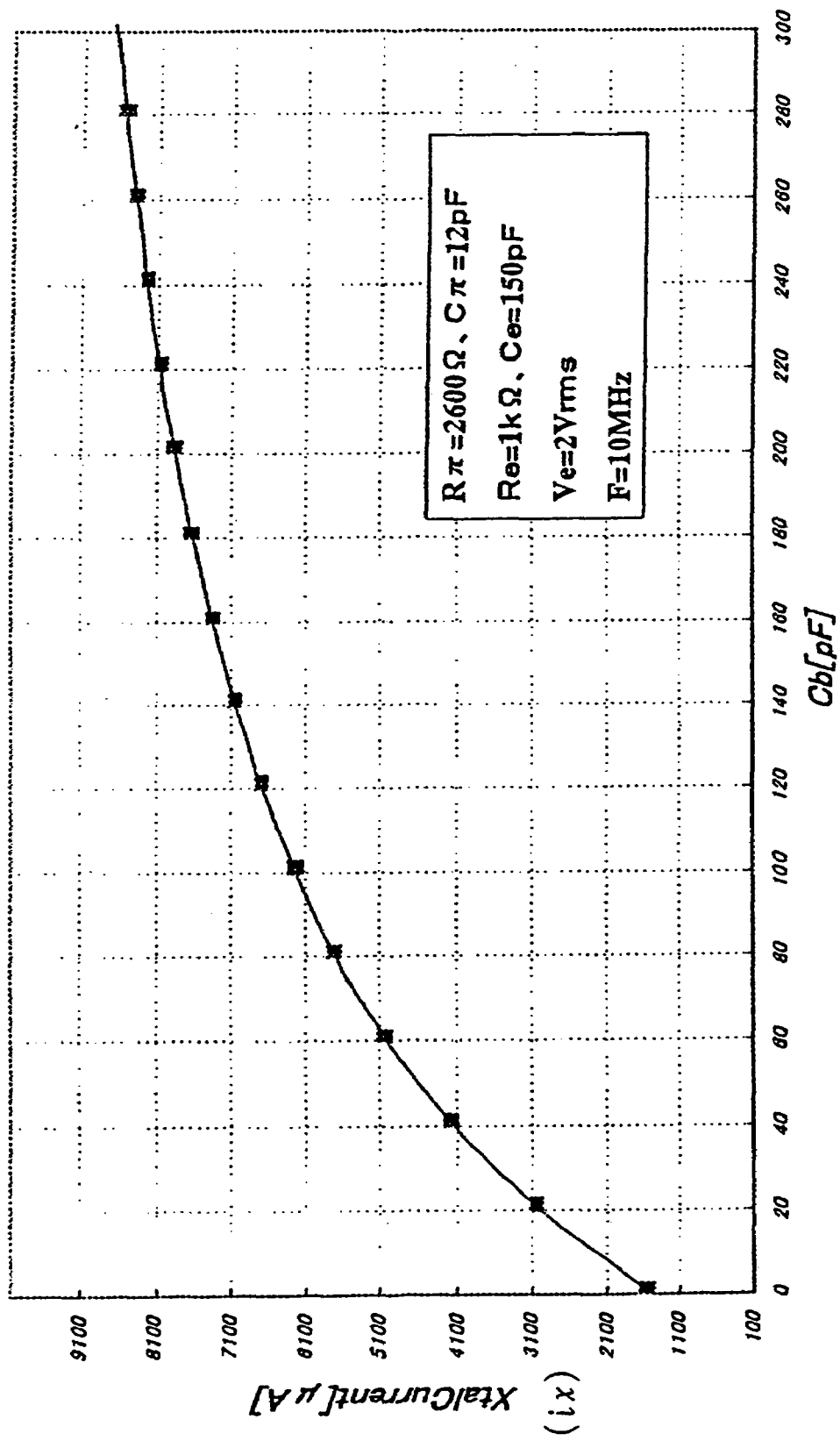
FIG. 23 illustrates a result of calculating a vibrator current when the conventional Colpitts oscillation circuit is in a steady oscillation.
Figure 24:
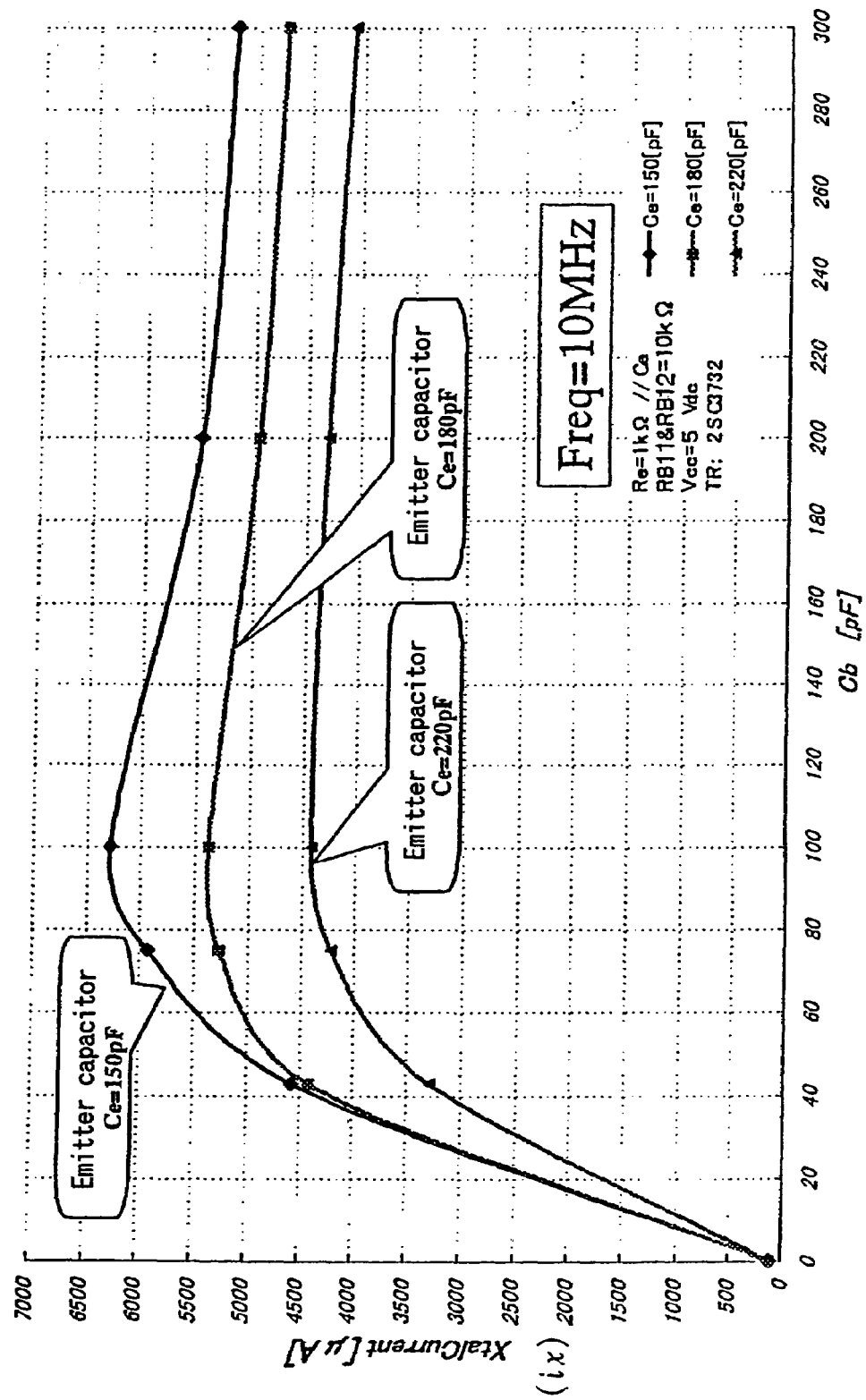
FIG. 24 illustrates a result of experiment of a vibrator current when the conventional Colpitts oscillation circuit is in a steady oscillation.

A most important characteristic of the present invention is that the capacitor Cce is inserted and connected between the collector and the emitter of the oscillation transistor TR1 (i.e., between the collector of the transistor TR2 and the emitter of the transistor TR1, in the case of the cascade connection). The phase of the emitter output and the phase of the collector output of the oscillation transistor TR1 are basically shifted by 180 degrees. Therefore, by connecting both output ends to the capacitor Cce, a negative feedback circuit is configured. As the output can be suppressed, the vibrator current can be decreased rapidly. However, this effect is obtained remarkably when the capacitance of the capacitor Cce is equal to or higher than the capacitance of the capacitor Ce (i.e., Cce≧Ce). This suppression phenomenon is not attributable to a reduction in the gain due to the suppression of the collector current or the base current of the transistor shown in FIG. 20. Therefore, the negative resistance tends to increase.

Figure 3:
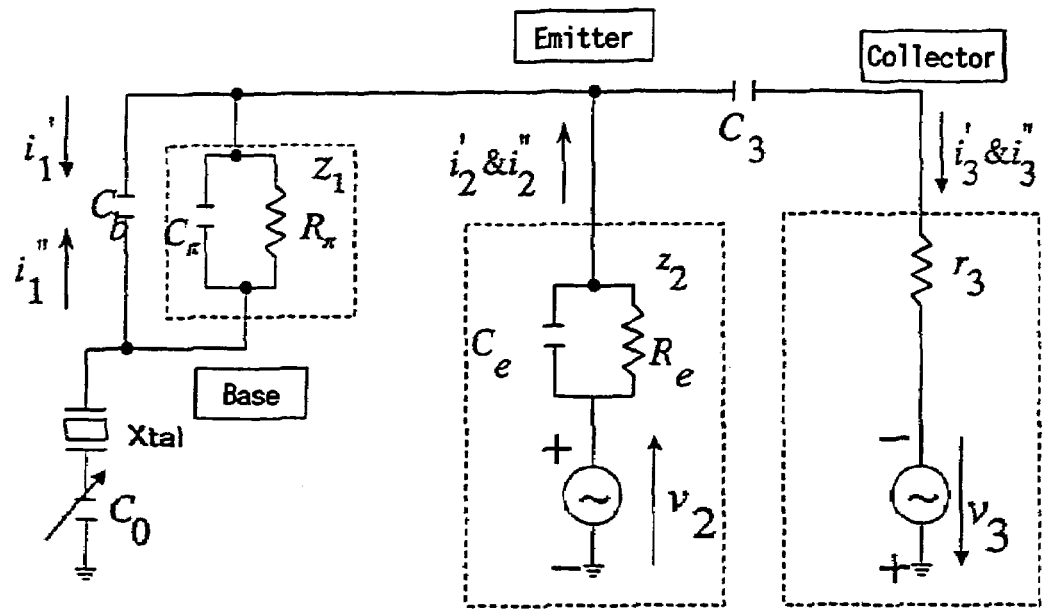
FIG. 3 illustrates an equivalent circuit when the Colpitts oscillation circuit is in a steady oscillation according to the first embodiment of the present invention.
Figure 4:
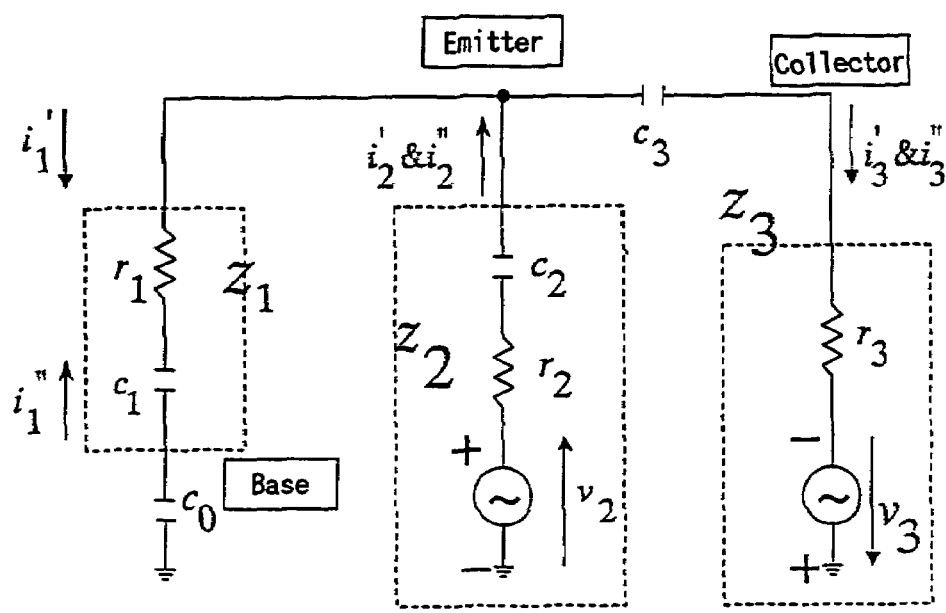
FIG. 4 illustrates a parallel-to-series conversion equivalent circuit when the Colpitts oscillation circuit is in a steady oscillation according to the present invention.
Figure 5:
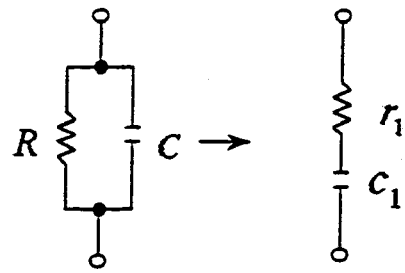
FIG. 5 illustrates a conversion expression of the parallel-to-series conversion circuit of the Colpitts oscillation circuit according to the present invention.

The circuit shown in FIG. 1 is expressed as an equivalent circuit, and the vibrator current is analyzed. FIG. 3 illustrates an equivalent circuit when the Colpitts oscillation circuit is in a steady oscillation according to the first embodiment shown in FIG. 1. FIG. 4 illustrates a parallel-to-series conversion equivalent circuit when the Colpitts oscillation circuit is in the steady oscillation. FIG. 5 illustrates a conversion expression of the parallel-to-series conversion circuit. First, expressions of z1, z2, and z3 shown in FIG. 4 are obtained respectively.

r1' is obtained by adding the series capacitance c1 of the oscillator to the series resistance r1 after the parallel-to-series conversion. c1' is obtained by connecting the frequency adjusting capacitor c0 to the series capacitance c1 after the series conversion.

$$z1 = r1' + 1/j\omega c'1,$$  (2)

$$z2 = r2 + 1/j\omega c2, z3 = r3 + /j\omega c3,$$

-continued
$$r1' = r1 + c1,$$

$$1/c1' = 1/c1 + 1/c0,$$

$$\begin{aligned} w &= z1z2 + z2z3 + z3z1 \\ &= (r1' + 1/j\omega c1')(r2 + 1/j\omega c2) + \\ &\quad (r2 + 1/j\omega c2)(r3 + 1/j\omega c3) + \\ &\quad (r3 + 1/j\omega c3)(r1' + 1/j\omega c1') \\ &= r1'r2 + r2r3 + r3r1' - \\ &\quad 1/\omega^2(1/c1' + 1/c2c3 + 1/c3c1') + \\ &\quad 1/j\omega\{(r2 + r3)/c1' + (r1' + r3)/c2 + (r1' + r2)/c3\} \\ &= p - jq \end{aligned}$$

where, $$P = r1'r2 + r2r3 + r3 - \\ r1' \cdot 1/\omega^2(1/c1'c2 + 1/c2c3 + 1/c3c1'),$$

$$q = 1/\omega\{(r2 + r3)/c1' + (r1' + r3)/c2 + (r1' + r2)/c3\}$$

Figure 6:
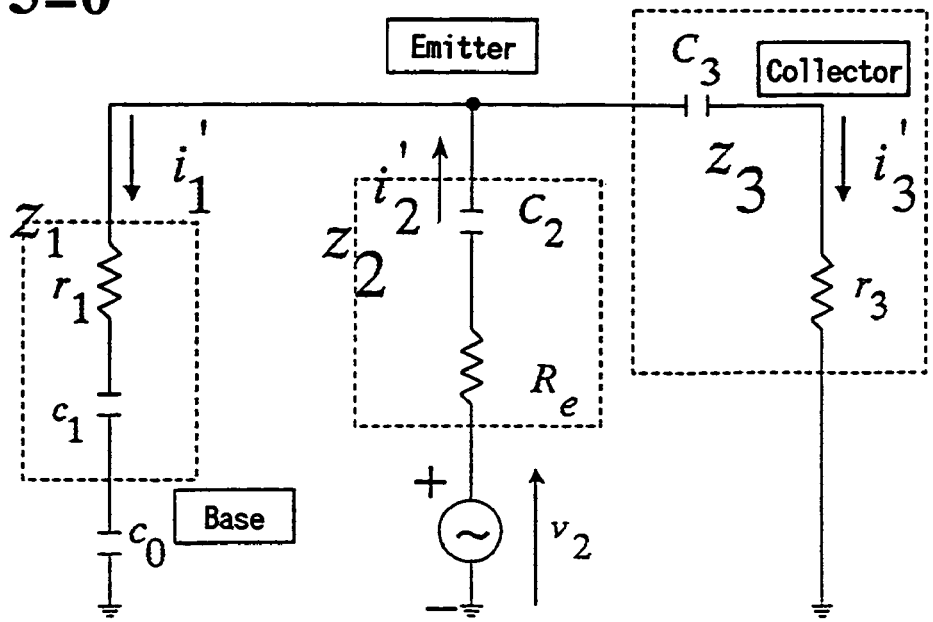
FIG. 6 illustrates an equivalent circuit when a collector power supply v3 of a parallel-to-series conversion equivalent circuit is short-circuited during a steady oscillation according to the present invention.

FIG. 6 illustrates an equivalent circuit when the collector power supply v3 shown in FIG. 4, is 0V. Exp. (3) expresses I' based on Exp. (2). Exp. (4) expresses the effective current.

$$i1'=v2/p^2+q^2\{pr3+q/\omega c3+j(qr3-p/\omega c3)\} \quad (3)$$

$$|i1'|=v2/p^2+q^2\times\{(pr3+q/\omega c3)^2+(qr3-p/\omega c3)^2\}^{1/2} \quad (4)$$

Figure 7:
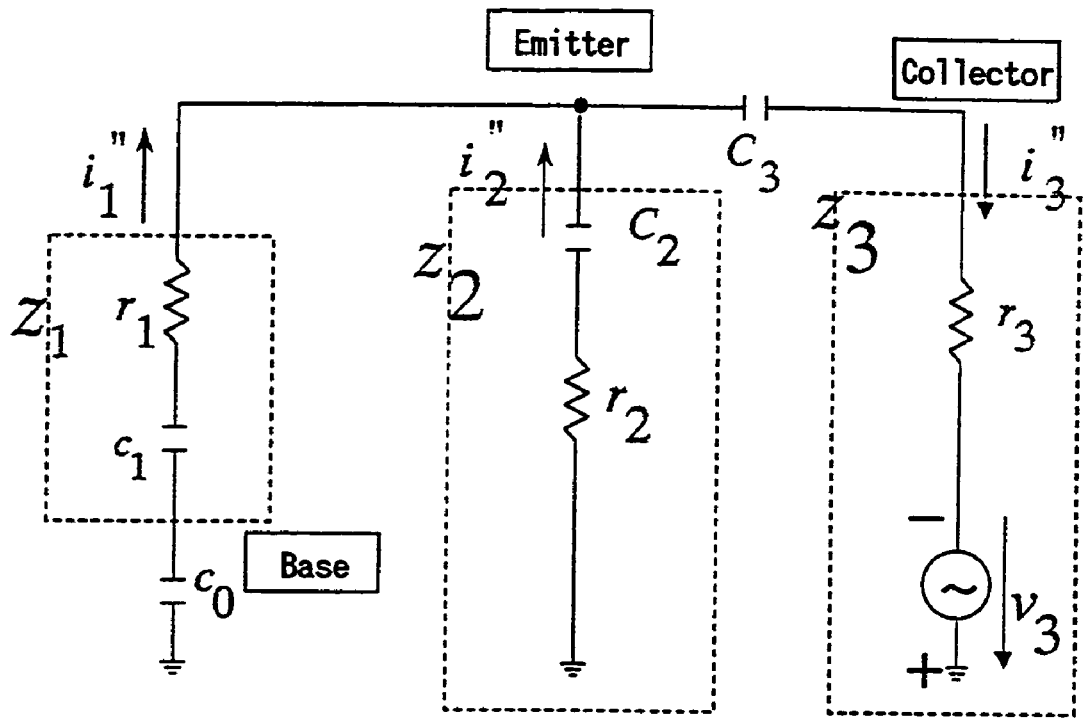
FIG. 7 illustrates an equivalent circuit when an emitter power supply v2 of a parallel-to-series conversion equivalent circuit is short-circuited during a steady oscillation according to the present invention.

FIG. 7 illustrates an equivalent circuit when the emitter power supply v2 is 0V. An oscillation current I" in this case can be expressed as;

$$i1''=v3/p^2+q^2\{pr2+q/\omega c3+j(qr2-p/\omega c2)\} \quad (5)$$

$$|i1''|=v3/p^2+q^2\times\{(pr2+q/\omega c2)^2+(qr2-p/\omega c2)^2\}^{1/2} \quad (6)$$

From the above expressions, the effective current of the vibrator current i can be obtained as a combined current in the Exps. (4) and (6).

$$|i|=|i1'|+|i1''| \quad (7)$$

Figure 8:
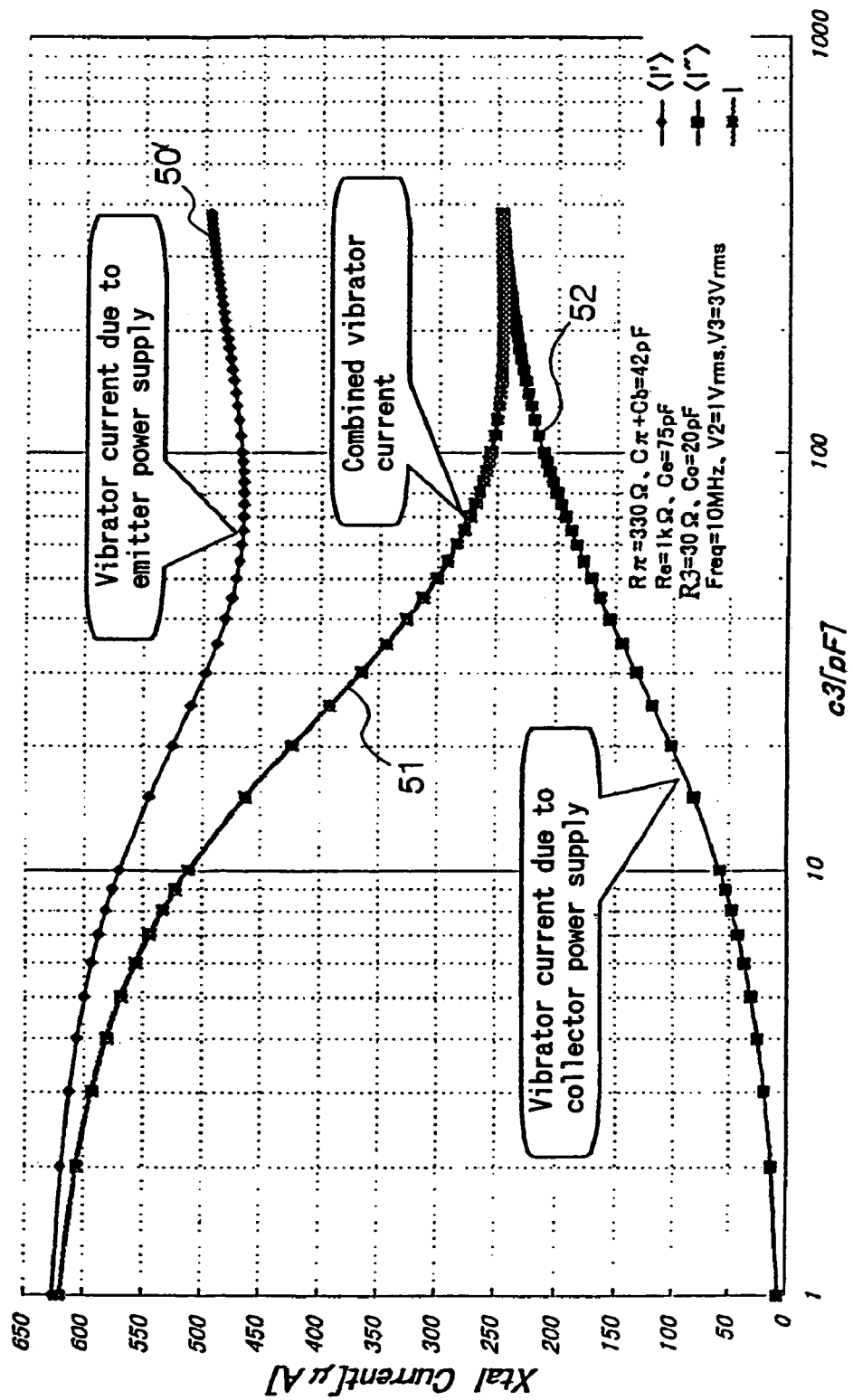
FIG. 8 is a graph showing a result of calculation based on Exps. (4), (6), and (7)

FIG. 8 is a graph showing a result of calculation based on the Exps. (4), (6), and (7). The abscissa represents capacitance of the capacitor c3, and the ordinate represents vibrator current. A characteristic curve 50 expresses a vibrator current i1' of the emitter power supply. A characteristic curve 52 expresses a vibrator current i1" of the collector power supply. A characteristic curve 51 expresses a vibrator current i of a combination of both currents. In the above characteristic curves, Rπ=330Q, Cπ+Cb=42 pF, Re=1 kΩ, Ce=75 pF, R3=30Ω, C0=20 pF, and Freq=10 MHz. From the above, it is clear that when the capacitance of the capacitor c3 exceeds 10 pF, the combined vibrator current i decreases rapidly.

Figure 9:
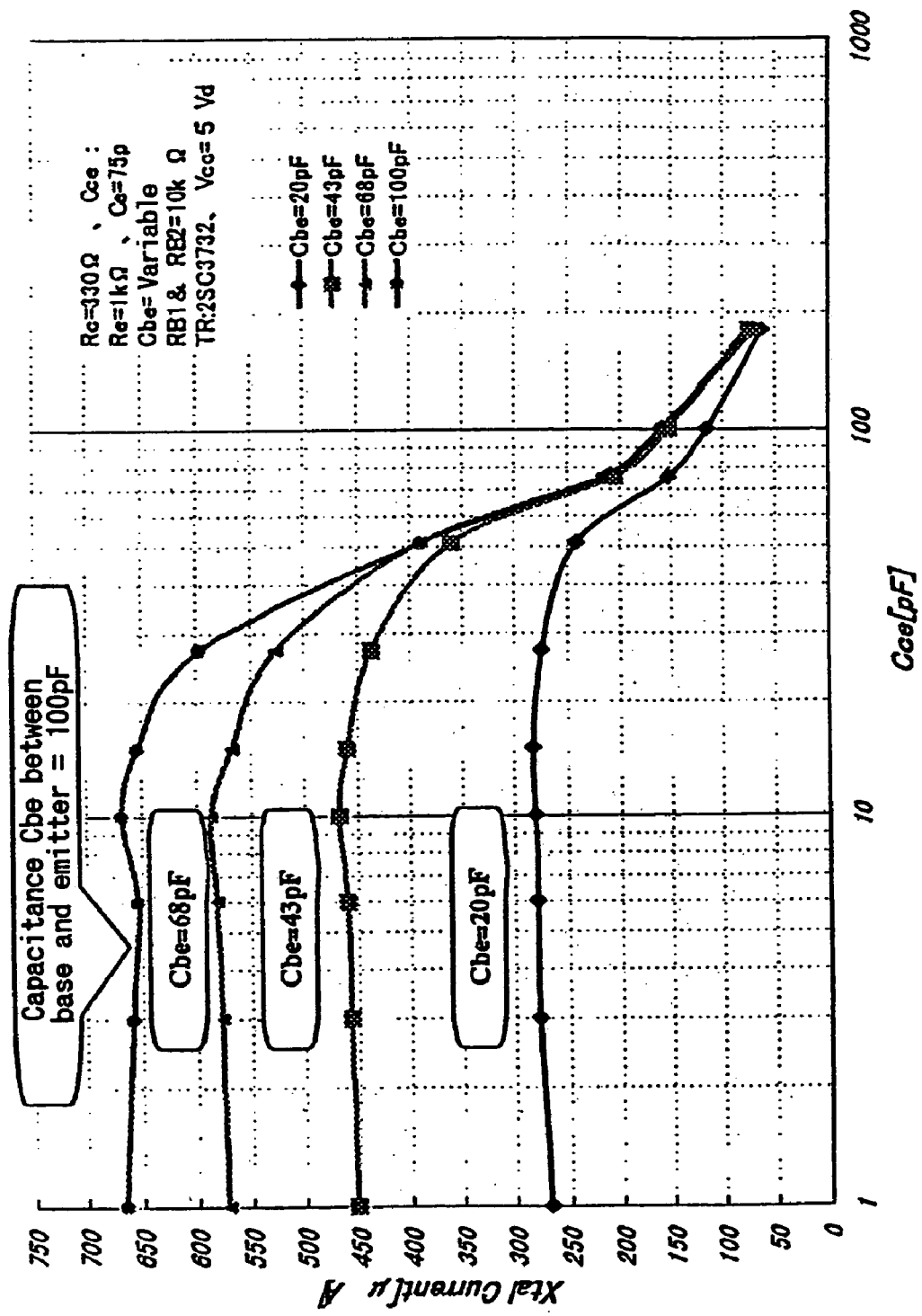
FIG. 9 is a graph showing a result of measurement by determining a constant of each part according to the first embodiment of the present invention.

FIG. 9 is a graph showing a result of measuring a vibrator current following the capacitance Cce when constants of each circuit constituent element according to the first embodiment shown in FIG. 1 are set as follows. Rc=330Ω, and Cce and Cbe are variable. Re=1 kΩ, Ce=75 pF, RB1=RB2=10 kΩ, and C1=100 pF. The capacitance Cbe between the base and the emitter is 20 pF, 43 pF, and 68 pF. The abscissa represents the capacitance Cce between the collector and the emitter, and the ordinate represents vibrator current. From FIG. 9, it is clear that when the capacitance Cce between the collector and the emitter becomes 30 pF or above, the vibrator current decreases rapidly, and the vibrator current becomes smaller when the capacitance Cbe between the base and the emitter is smaller.

Figure 10:
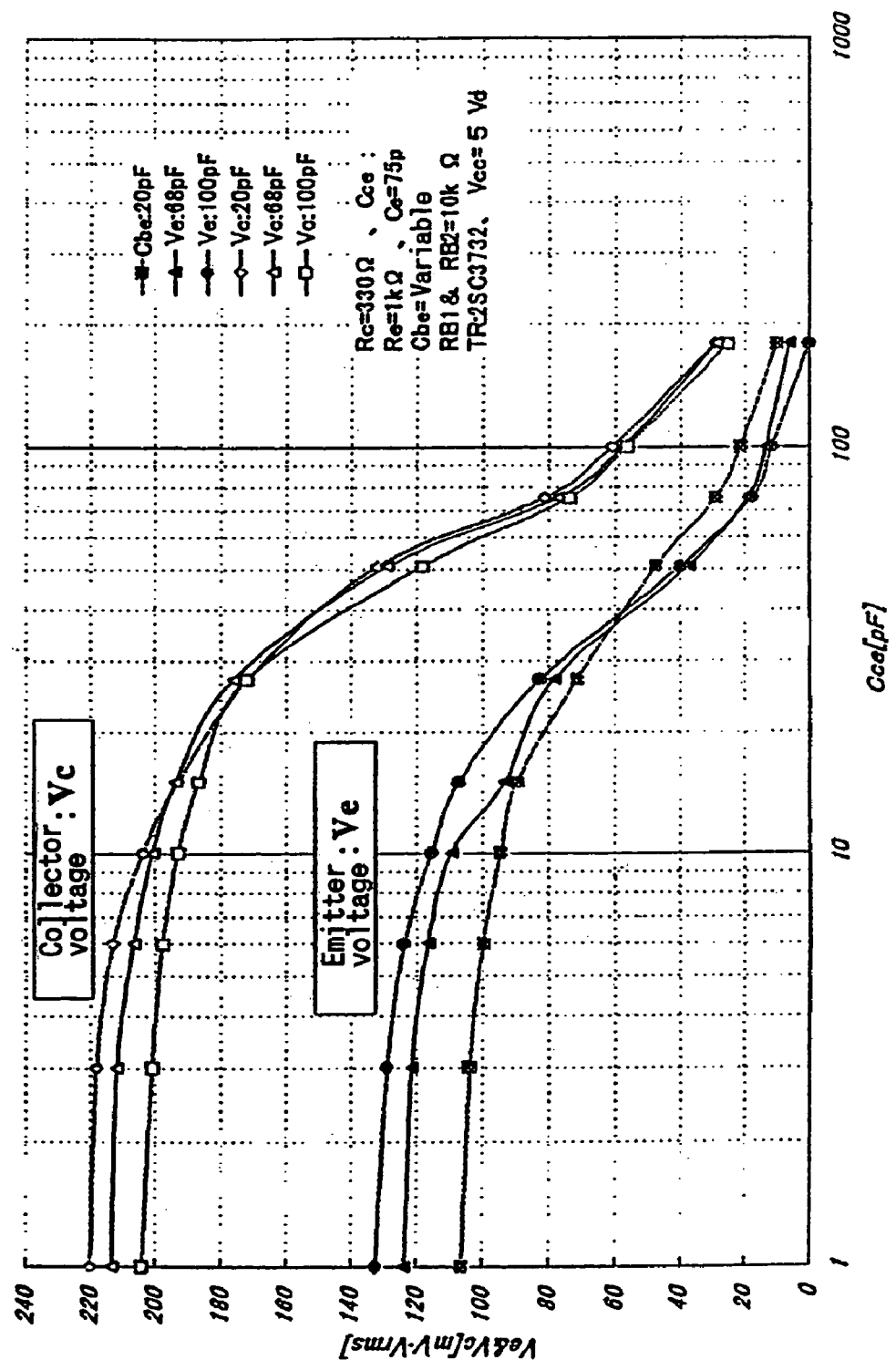
FIG. 10 is a graph showing changes in a collector output voltage and an emitter output voltage respectively versus a capacitance Cce between a collector and an emitter according to the present invention.

FIG. 10 is a graph showing changes in the collector output voltage Vc and the emitter output voltage Ve respectively versus the capacitance Cce between the collector and the emitter when the capacitance Cbe between the base and the emitter is used as a parameter (20 pF, 68 pF, and 100 pF). In other words, when the capacitance Cce between the collector and the emitter increases, the collector output voltage Vc and the emitter output voltage Ve are suppressed rapidly. Following this, the vibrator current is also suppressed rapidly.

Figure 11:
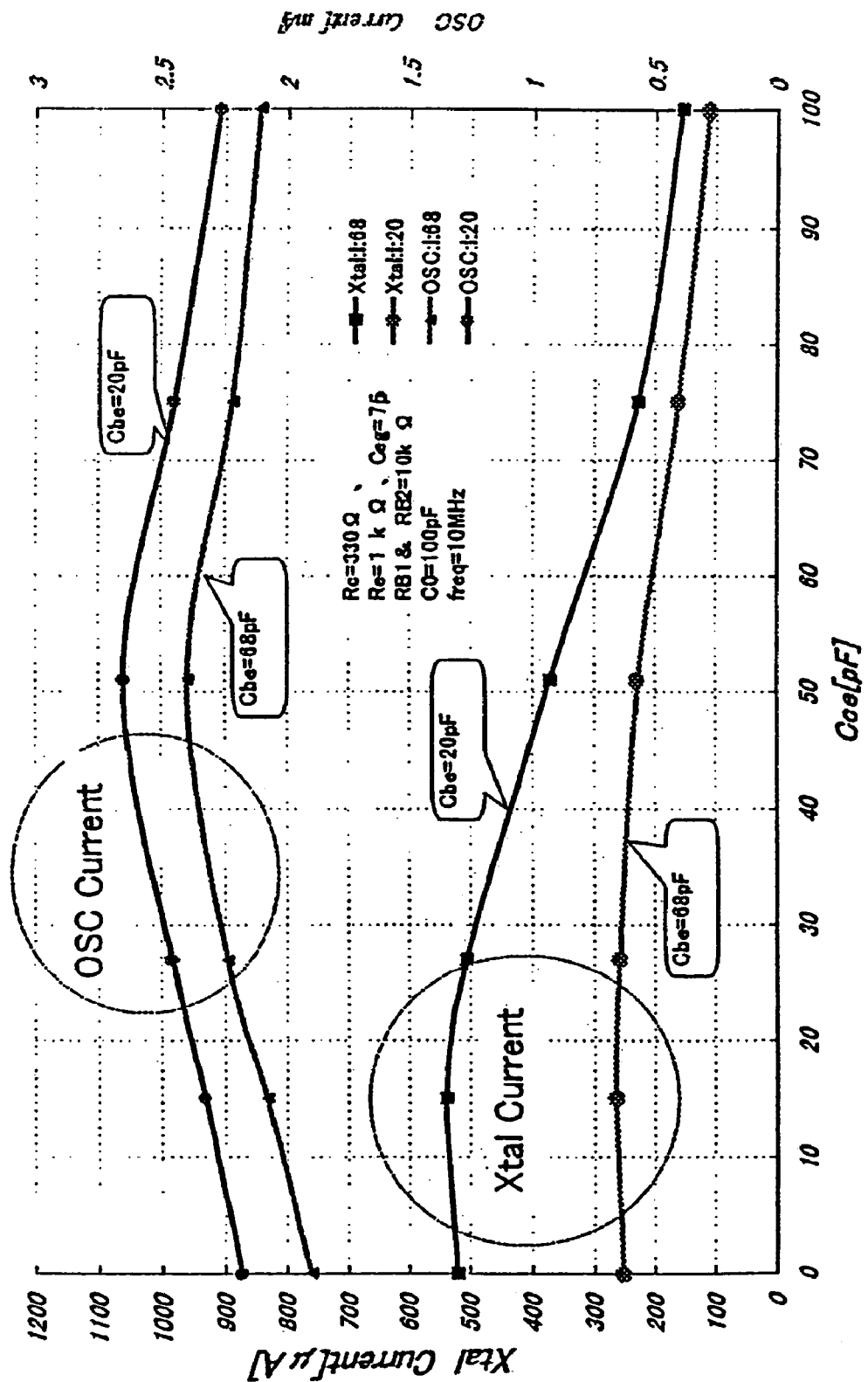
FIG. 11 is a graph showing changes in a vibrator current and an oscillation circuit current respectively versus the capacitance Cce between a collector and an emitter according to the present invention.

FIG. 11 is a graph showing changes in the vibrator current and the oscillation circuit current respectively versus the capacitance Cce between the collector and the emitter when the capacitance Cbe between the base and the emitter is used as a parameter of 20 pF and 68 pF according to the first embodiment shown in FIG. 1. From FIG. 11, it is clear that the oscillation circuit current changes little versus the suppression of the vibrator current. It is understood from this that the vibrator current is not suppressed because of the reduction in the gain due to the suppression of the base current and the collector current of the transistor TR1.

Figure 12:
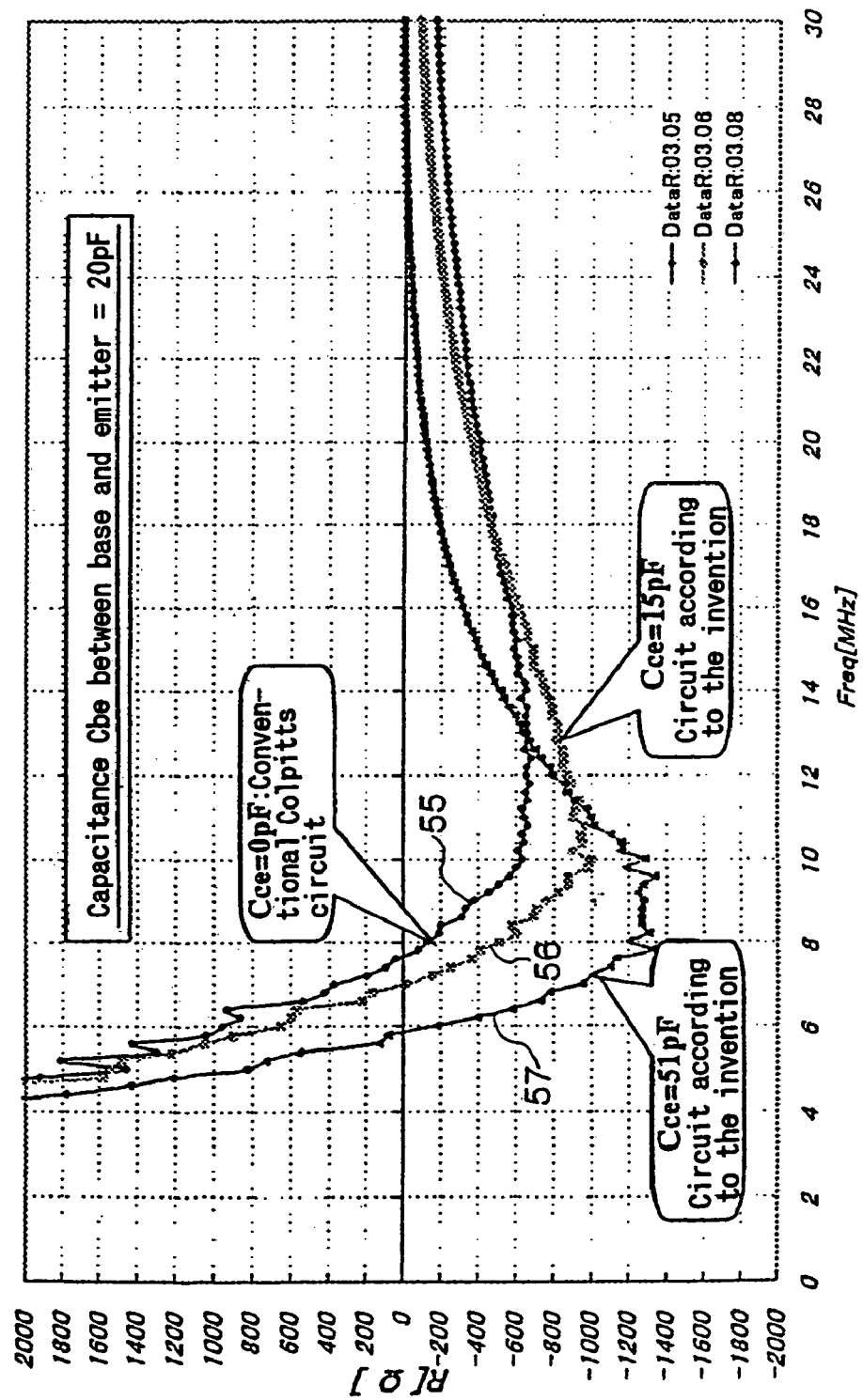
FIG. 12 illustrates negative resistance characteristics versus a change in frequency when the capacitance Cce between a collector and an emitter is used as a parameter according to the present invention.
Figure 13:
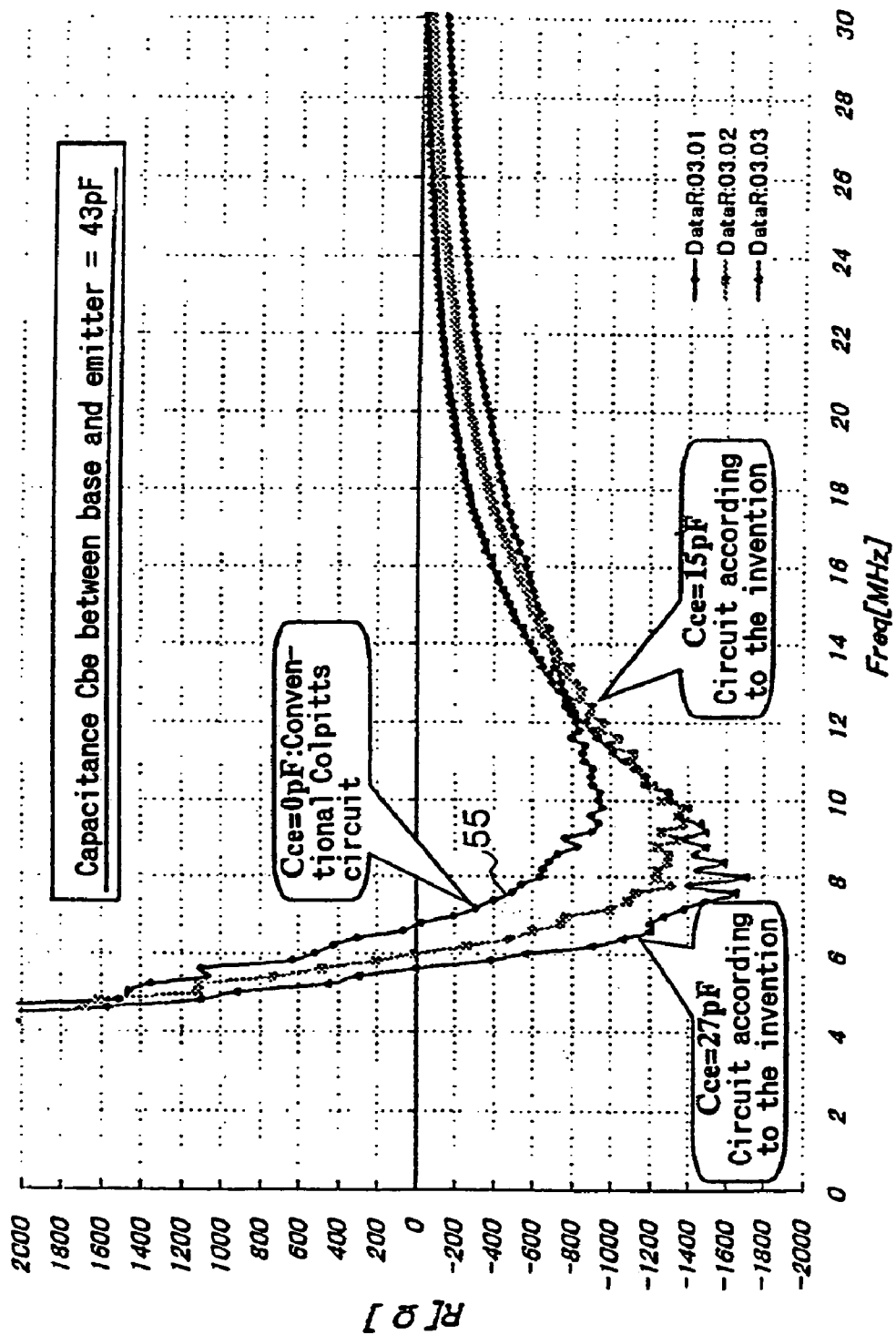
FIG. 13 illustrates negative resistance characteristics versus a change in frequency when the capacitance Cce between a collector and an emitter is used as a parameter according to the present invention.

FIG. 12 and FIG. 13 illustrate results of measuring negative resistance characteristics versus a change in frequency when the capacitance Cce between the collector and the emitter is used as a parameter (0 pF, 15 pF, and 51 pF) according to the first embodiment shown in FIG. 1. In FIG. 12, the capacitance Cbe between the base and the emitter is 20 pF. In FIG. 13, the capacitance Cbe between the base and the emitter is 43 pF. In FIG. 12 and FIG. 13, a reference numeral 55 denotes frequency negative resistance characteristics in the conventional Colpitts circuit (when Cce=0 pF). It can be confirmed that the negative resistance increases when the Cce is set to a suitable value.

Figure 14:
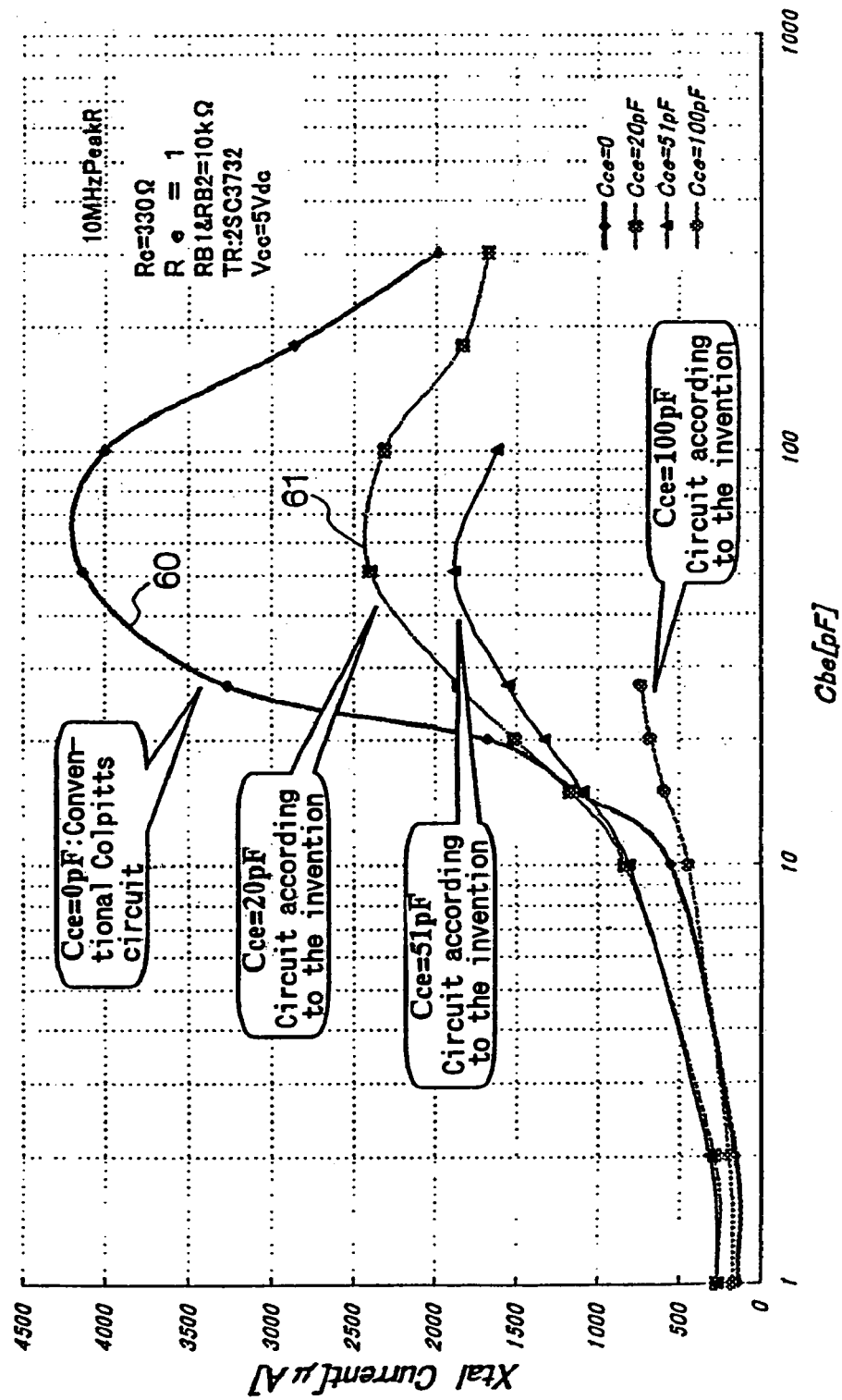
FIG. 14 illustrates a result of measuring a vibrator current according to the present invention.

FIG. 14 illustrates a relationship between the vibrator current and the capacitance Cbe between the base and the emitter and the capacitance Cce between the collector and the emitter respectively, when the negative resistance is at a maximum value in the oscillation frequency 10 MHz. In FIG. 14, a solid line 60 represents vibrator current characteristics in the conventional Colpitts circuit (when Cce=0 pF). A solid line 61 represents vibrator current characteristics according to the present invention. By comparing these characteristic curves, it is clear that the oscillation circuit according to the present invention has the vibrator current that decreases more rapidly.

Figure 15:
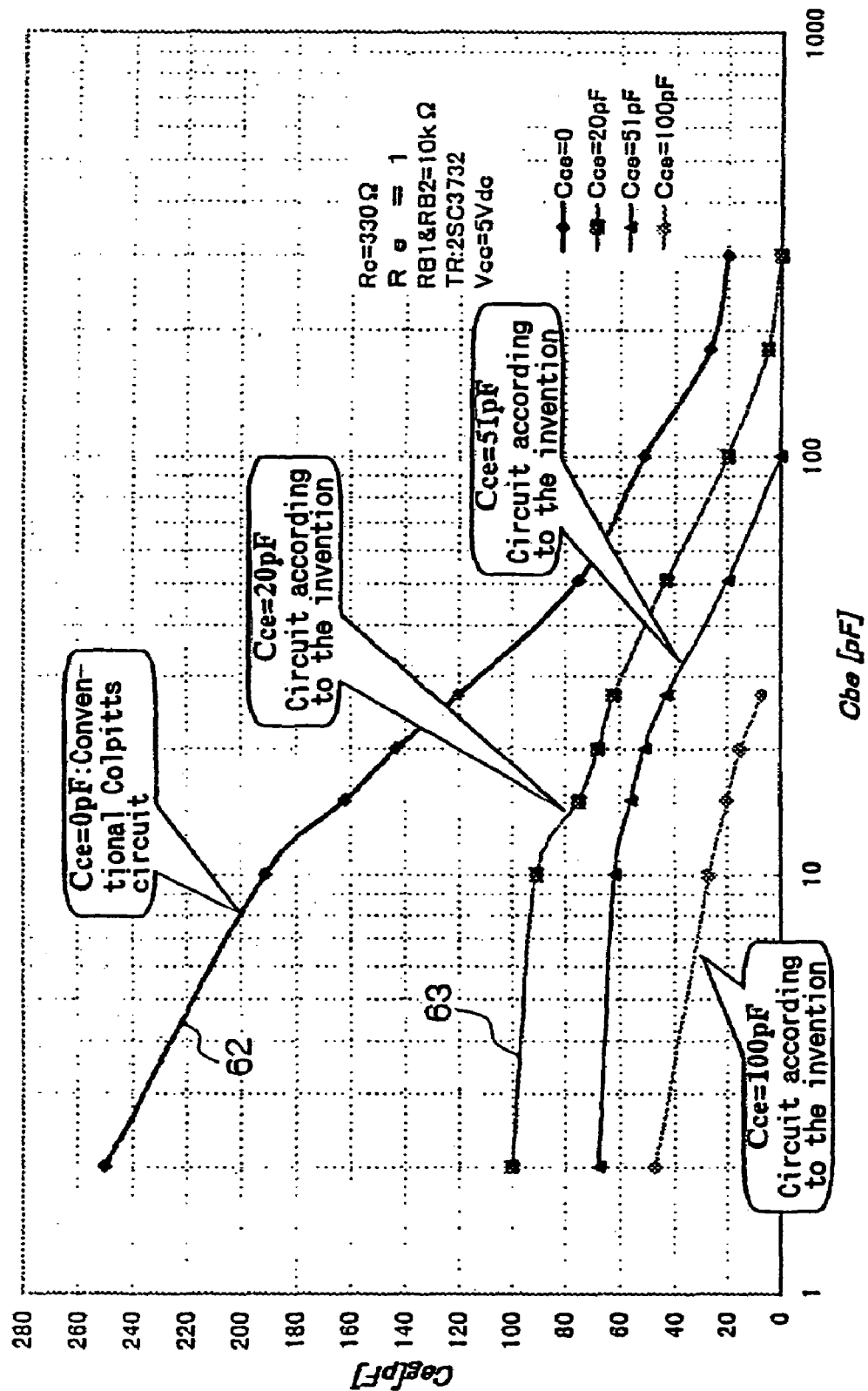
FIG. 15 illustrates a result of measuring Cbe and Ceg at a maximum negative resistance of 10 MHz.

FIG. 15 illustrates a relationship between the capacitance Cbe between the base and the emitter and a capacitance Ceg between the emitter and the ground when the negative resistance is at a maximum value in the oscillation frequency 10 MHz, where the capacitance Cce between the collector and the emitter is used as a parameter (0 pF, 20 pF, 51 pF, and 100 pF). In FIG. 15, a solid line 62 represents characteristics in the conventional Colpitts circuit (when Cce=0 pF). A solid line 63 represents characteristics according to the present invention. By comparing these characteristic curves, it is clear that the oscillation circuit according to the present invention can obtain characteristics having smaller change in the capacitance Ceg between the emitter and the ground.

Figure 16:
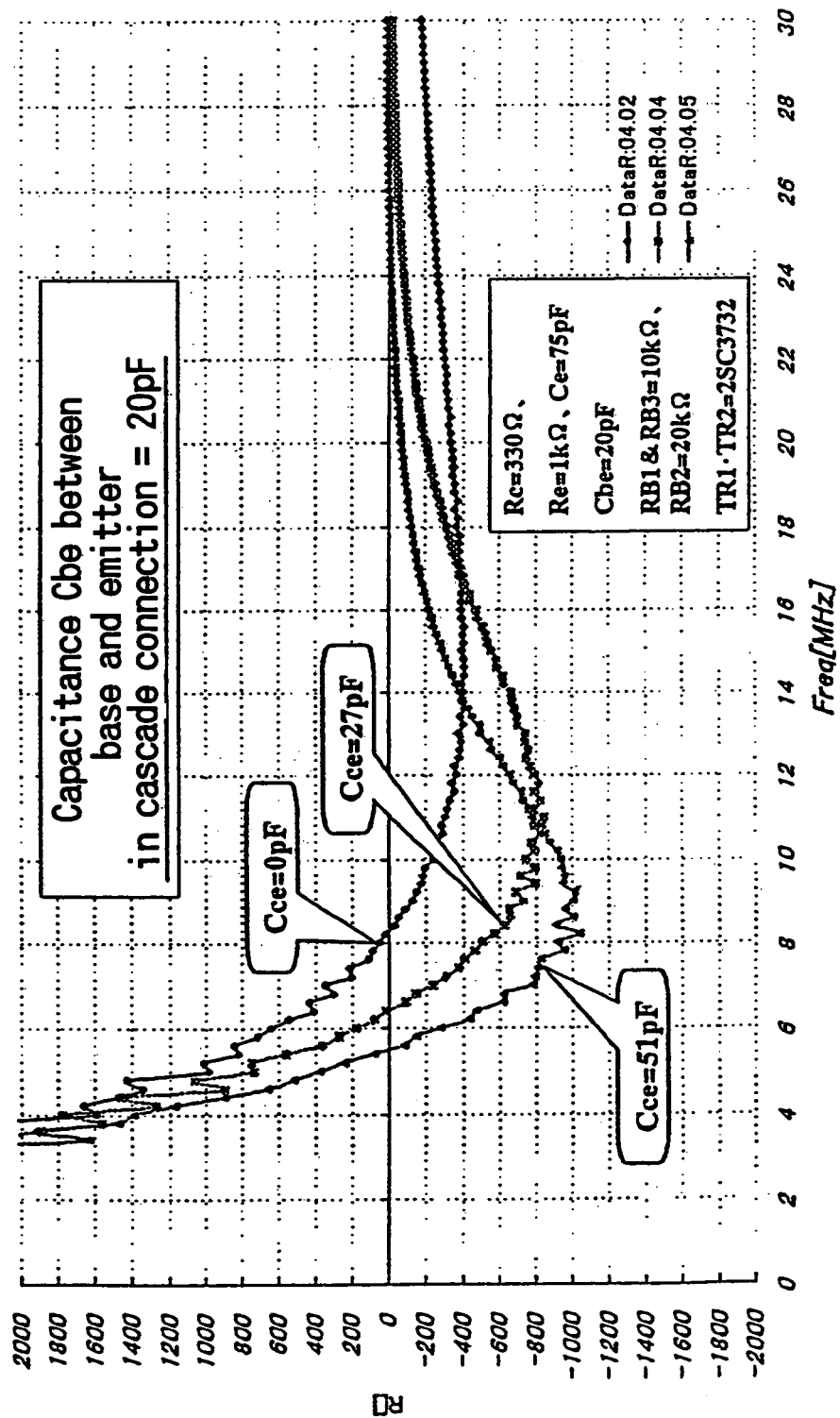
FIG. 16 illustrates a result of measuring a negative resistance when transistors are connected in cascade according to the present invention.

FIG. 16 illustrates negative resistance characteristics when transistors shown in FIG. 2 are connected in cascade. As is clear from FIG. 16, when the capacitance Cce between the collector and the emitter is set to a suitable value in the cascade connection, the negative resistance increases like that in FIGS. 12 and 13.

Figure 17:
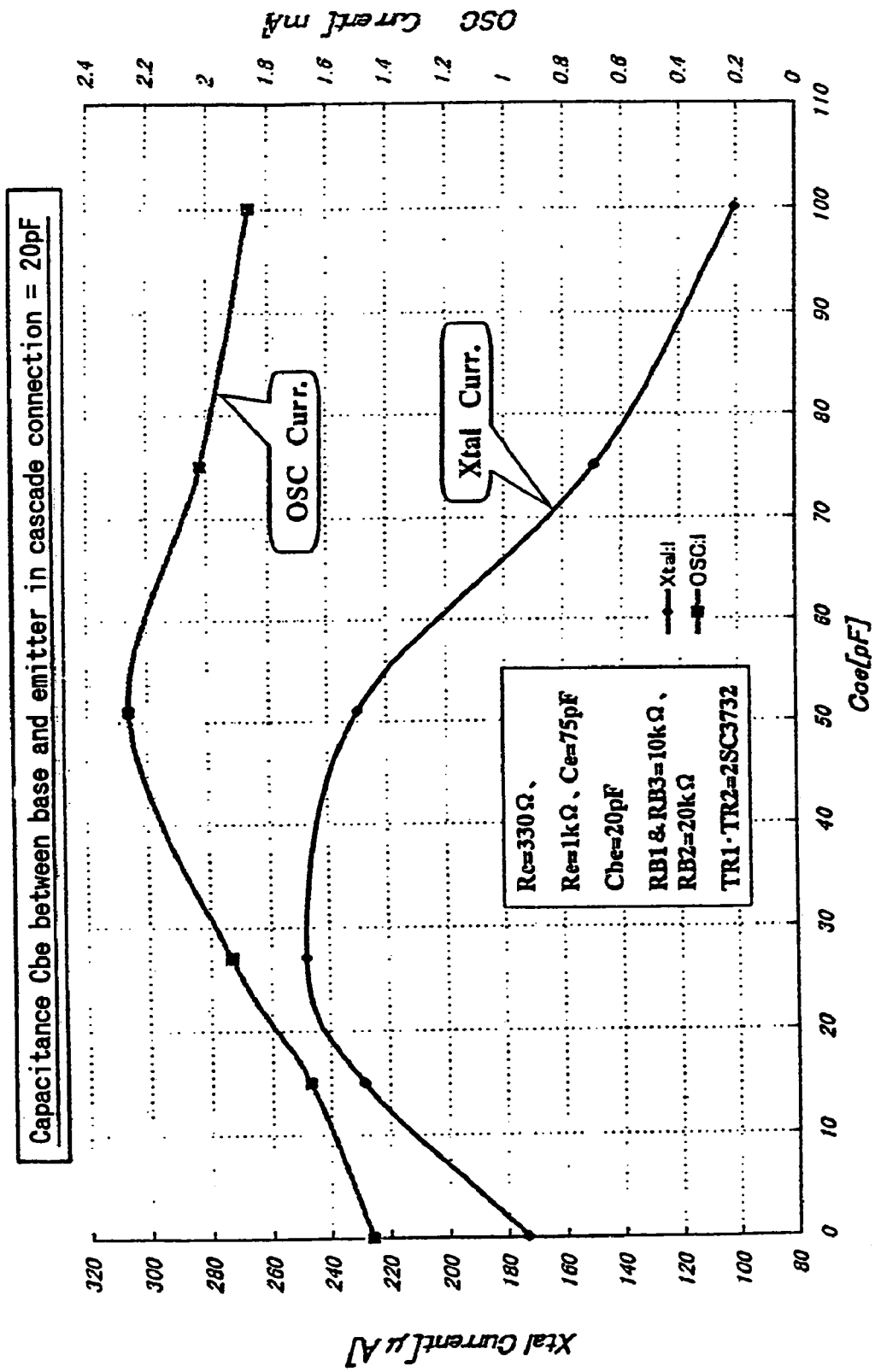
FIG. 17 illustrates a result of measuring a vibrator current and an oscillation circuit current according to the present invention.
Figure 18:
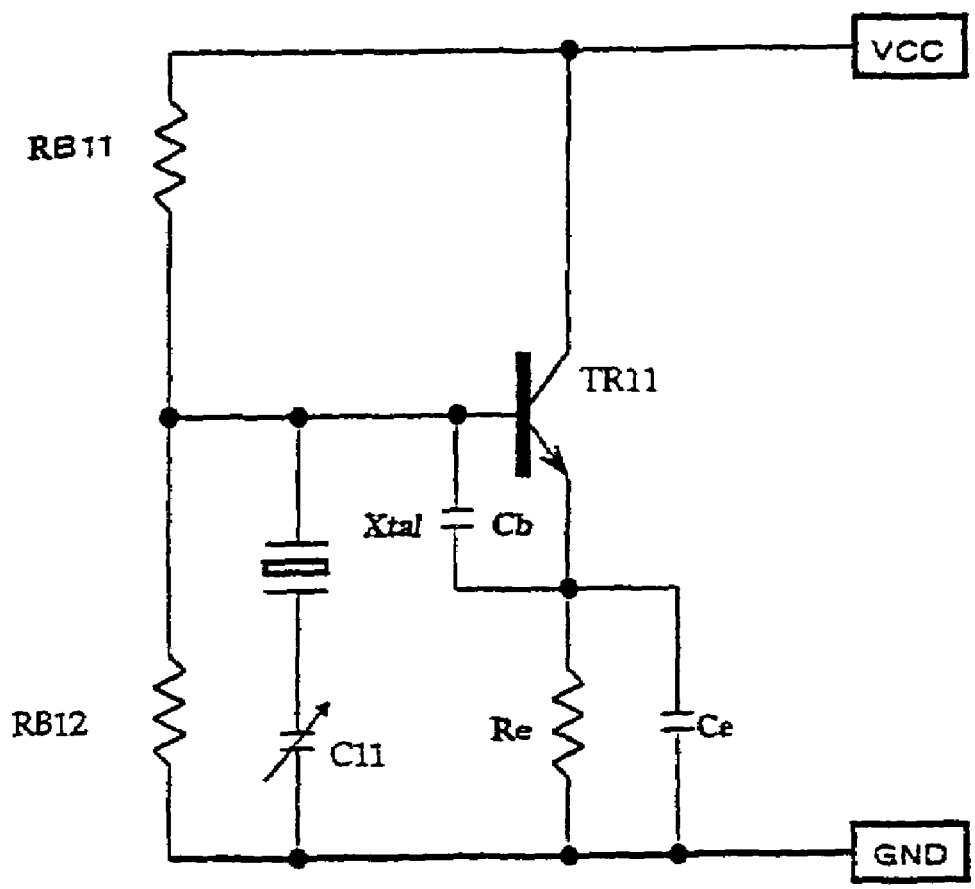
FIG. 18 illustrates a conventional Colpitts oscillation circuit.
Figure 19:
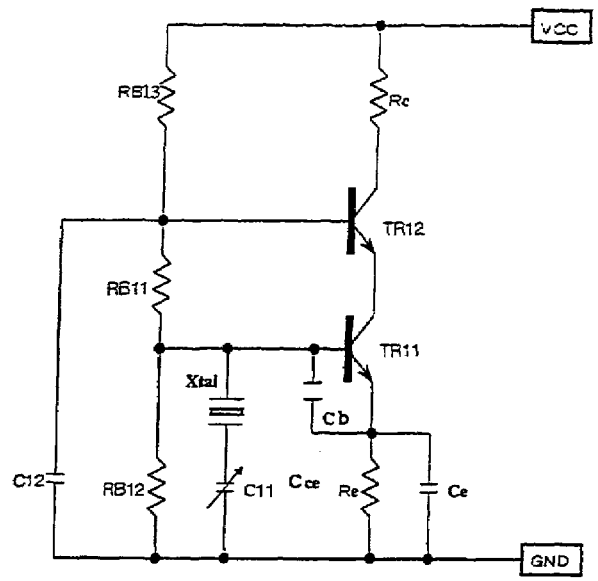
FIG. 19 illustrates the conventional Colpitts oscillation circuit connected in cascade.

FIG. 17 illustrates changes in the vibrator current and the oscillation circuit current versus the capacitance Cce between the collector and the emitter, when the capacitance Cbe between the base and the emitter is 20 pF in the cascade connection shown in FIG. 2. Cce=0 pF corresponds to that in the conventional Colpitts circuit. In this case, the vibrator current is 170 $\mu$A, and the circuit current is 1.5 mA. When Cce=50 pF, the vibrator current is 230 $\mu$A, and the circuit current is 2.3 mA (maximum). When Cce=100 pF, the vibrator current is 100 $\mu$A, and the circuit current is 1.9 mA. In other words, FIG. 17 indicates that when a suitable value is selected for Cce, the vibrator current can be suppressed. This suppression is not attributable to the suppression of the circuit current.

As explained above, according to the first aspect of the present invention, the collector and the emitter of the oscillation transistor are connected with a capacitor. With this arrangement, the output is suppressed by a signal of a negative phase, and the base current is suppressed at the same time. As a result, the vibrator current can be decreased, and the negative resistance can be increased.

According to the second aspect of the invention, the basic oscillation circuit is a Colpitts oscillator. Therefore, the circuit configuration is simple, and a stable oscillation can be achieved.

According to the third aspect of the invention, as the transistors are connected in cascade, the total gain is equivalent to that of the grounded-emitter circuit. The bandwidth can be secured up to the cut-off frequency of the grounded-base circuit. Therefore, an oscillator having excellent high-frequency characteristics can be obtained.

According to the fourth aspect of the invention, by connecting the base of the second transistor to the ground via the capacitor, this transistor can be made as the grounded-emitter circuit. Therefore, a cascade circuit can be configured together with a transmission transistor.

According to the fifth aspect of the invention, the bases of the oscillation amplifier transistor and the second transistor are biased at a predetermined potential respectively. Therefore, an oscillator having little waveform distortion can be obtained.

According to the sixth aspect of the invention, the capacitance of the capacitor inserted between the collector and the emitter is set approximately equal to or higher than the capacitance of the capacitor inserted between the emitter of the oscillation amplifier transistor and the ground. With this arrangement, signals of substantially the same impedance are suppressed. Therefore, an oscillation waveform having little waveform distortion can be output.

According to the seventh aspect of the invention, the vibrator current can be decreased while securely carrying out oscillation.

The invention claimed is:

1. A piezoelectric oscillator comprising a piezoelectric vibrator that has a piezoelectric element which is excited in a predetermined frequency, an oscillation amplifier transistor that excites the piezoelectric element by flowing a current to the piezoelectric element, a combined capacitor that is connected between a base of the oscillation amplifier transistor and the ground and that forms a part of a load capacitance, and an emitter resistor that is inserted between an emitter of the oscillation amplifier transistor and the ground, wherein a non-inductive load is connected to a collector of the oscillation amplifier transistor, and a capacitor is inserted between the collector and the emitter of the oscillation amplifier transistor;

the combined capacitor is composed of a capacitor that is connected between the base and the emitter of the oscillation amplifier transistor and a capacitor that is connected between the emitter and the ground, and the base of the oscillation amplifier transistor is biased at a predetermined potential; and the capacitance of the capacitor inserted between the collector and the emitter is at or above the capacitance of the capacitor inserted between the emitter of the oscillation amplifier transistor and the ground.

2. A piezoelectric oscillator comprising a piezoelectric vibrator that has a piezoelectric element which is excited in a predetermined frequency, an oscillation amplifier transistor that continuously excites the piezoelectric element by flowing a current to the piezoelectric element, a combined capacitor that is connected between a base of the oscillation amplifier transistor and the ground and that forms a part of a load capacitance, and an emitter resistor that is inserted between an emitter of the oscillation amplifier transistor and the ground, wherein a second transistor is connected in cascade to the collector of the oscillation amplifier transistor, a non-inductive load is connected to a collector of the second transistor connected in cascade, and a capacitor is inserted between the collector of the second transistor and the emitter of the oscillation amplifier transistor;

a base of the second transistor is grounded via a capacitor;

the combined capacitor is connected between the base and the emitter of the oscillation amplifier transistor and between the emitter and the around respectively, and the base of the oscillation amplifier transistor and the base of the second transistor are biased at a predetermined potential respectively; and the capacitance of the capacitor inserted between the collector and the emitter is at or above the capacitance of the capacitor inserted between the emitter of the oscillation amplifier transistor and the ground.

3. The piezoelectric oscillator according to any one of claims 1 and 2, wherein the capacitor inserted between the collector and the emitter has a predetermined capacitance thereby to suppress a collector output voltage and an emitter output voltage of the oscillation amplifier transistor and suppress a current of the piezoelectric element.

4. The piezoelectric oscillator according to any one of claims 1 and 2, wherein the capacitance of the capacitor inserted between the collector and the emitter is at or above the capacitance of the capacitor inserted between the emitter of the oscillation amplifier transistor and the ground.

5. The piezoelectric oscillator according to any one of claims 1 and 2, wherein the capacitor inserted between the collector and the emitter has a predetermined capacitance thereby to suppress a collector output voltage and an emitter output voltage of the oscillation amplifier transistor and suppress a current of the piezoelectric element.

* * * * *